US010325947B2

United States Patent
Velichko et al.

(10) Patent No.: US 10,325,947 B2
(45) Date of Patent: Jun. 18, 2019

(54) GLOBAL SHUTTER IMAGE SENSORS WITH LIGHT GUIDE AND LIGHT SHIELD STRUCTURES

(71) Applicant: Semiconductor Components Industries, LLC, Phoenix, AZ (US)

(72) Inventors: Sergey Velichko, Boise, ID (US); Gennadiy Agranov, San Jose, CA (US); Victor Lenchenkov, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 779 days.

(21) Appl. No.: 14/157,492

(22) Filed: Jan. 16, 2014

(65) Prior Publication Data

US 2014/0197301 A1 Jul. 17, 2014

Related U.S. Application Data

(60) Provisional application No. 61/753,852, filed on Jan. 17, 2013.

(51) Int. Cl.
*H01L 27/00* (2006.01)
*H01L 27/146* (2006.01)
(Continued)

(52) U.S. Cl.
CPC ..... *H01L 27/14625* (2013.01); *H04N 5/2329* (2013.01); *H04N 5/3745* (2013.01);
(Continued)

(58) Field of Classification Search
CPC ............ H01L 27/146; H01L 27/14609; H01L 27/14625; H01L 27/14643; H04N 5/3745; H04N 5/37452; H04N 5/2329
(Continued)

(56) References Cited

U.S. PATENT DOCUMENTS 5,444,270 A 8/1995 Cunningham et al.
6,157,042 A 12/2000 Dodd
(Continued)

OTHER PUBLICATIONS

Velichko, U.S. Appl. No. 13/746,211, filed Jan. 21, 2013.

*Primary Examiner* — Georgia Y Epps
*Assistant Examiner* — Kevin Wyatt
(74) *Attorney, Agent, or Firm* — Treyz Law Group, P.C.; Kendall W. Abbasi; Joseph F. Guihan

(57) ABSTRACT

An image sensor operable in global shutter mode may include an array of image pixels. Each image pixel may include a photodiode for detecting incoming light and a separate storage diode for temporarily storing charge. To maximize the efficiency of the image pixel array, image pixels may include light guide structures and light shield structures. The light guide structures may be used to funnel light away from the storage node and into the photodiode, while the light shield structures may be formed over storage nodes to block light from entering the storage nodes. The light guide structures may fill cone-shaped cavities in a dielectric layer, or the light guide structures may form sidewalls having a ring-shaped horizontal cross section. Metal interconnect structures in the dielectric layer may be arranged in concentric annular structures to form a near-field diffractive element that funnels light towards the appropriate photodiode.

12 Claims, 4 Drawing Sheets

(51) Int. Cl.
*H04N 5/3745* (2011.01)
*H04N 5/232* (2006.01)

(52) U.S. Cl.
CPC ... *H04N 5/37452* (2013.01); *H01L 27/14609* (2013.01); *H01L 27/14643* (2013.01)

(58) Field of Classification Search
USPC ........ 250/208.1, 214 A, 214.1; 348/294, 308
See application file for complete search history.

(56) References Cited

U.S. PATENT DOCUMENTS

| | | | |
|---|---|---|---|
| 7,072,093 B2 | 7/2006 | Piehl et al. | |
| 7,566,942 B2 | 7/2009 | Viens et al. | |
| 2002/0060742 A1* | 5/2002 | Takubo | H01L 27/14806 348/241 |
| 2004/0082095 A1* | 4/2004 | Moriyama | H01L 27/1462 438/69 |
| 2005/0127463 A1* | 6/2005 | Yaung | H01L 27/1462 257/443 |
| 2009/0189055 A1* | 7/2009 | Lin | H01L 27/14621 250/208.1 |
| 2009/0201400 A1* | 8/2009 | Zhang | H01L 27/14609 348/296 |
| 2009/0250777 A1* | 10/2009 | Takamiya | H01L 27/14629 257/432 |
| 2010/0276574 A1* | 11/2010 | Manabe | H04N 5/353 250/214 A |
| 2010/0289939 A1* | 11/2010 | Ogino | G02B 1/11 348/340 |
| 2011/0031575 A1* | 2/2011 | Nakagawa | H01L 27/14818 257/432 |
| 2011/0032398 A1* | 2/2011 | Lenchenkov | H01L 27/14621 348/294 |
| 2011/0163364 A1* | 7/2011 | Kim | H01L 27/14618 257/294 |
| 2012/0003782 A1* | 1/2012 | Byun | H01L 27/14625 438/72 |
| 2012/0274811 A1* | 11/2012 | Bakin | H04N 3/1593 348/239 |
| 2013/0250150 A1* | 9/2013 | Malone | G02B 15/00 348/262 |
| 2013/0292547 A1* | 11/2013 | Tay | H01L 27/14621 250/208.1 |
| 2015/0035028 A1* | 2/2015 | Fan | H01L 27/14623 257/292 |

* cited by examiner

GLOBAL SHUTTER IMAGE SENSORS WITH LIGHT GUIDE AND LIGHT SHIELD STRUCTURES

This application claims the benefit of provisional patent application No. 61/753,852, filed Jan. 17, 2013, which is hereby incorporated by reference herein in its entirety.

BACKGROUND

This relates generally to imaging sensors, and more particularly, to imaging sensors operable in global shutter mode.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. In a configuration that includes frontside illuminated image pixels, a dielectric stack is formed on the front surface of the substrate directly on top of the photodiodes. The dielectric stack includes metal routing lines and metal vias formed in dielectric material. Image light passes through the dielectric stack to the photodiodes. In a configuration that includes backside illuminated image pixels, the photodiodes receive image light through the backside of the semiconductor substrate so that the light does not pass through the dielectric stack.

However, in conventional frontside and backside illuminated image pixels, the image light only makes a single pass through the semiconductor substrate. For this reason, some of the light can pass through the photodiode without being converted into detectable electric charge. This undetected light can negatively affect the quantum efficiency of the pixel and can limit the performance of the device, particularly in low-light imaging operations.

Undetected light (sometimes referred to as parasitic light or stray light) can be especially problematic in conventional image sensors operating in global shutter mode. For example, pixels in an image sensor that operates in global shutter mode may each include a photodiode for detecting incoming light and a separate storage diode for temporarily storing charge. If care is not taken, parasitic light may be scattered or diffracted into the storage node, lowering the global shutter pixel efficiency and leading to image artifacts such as vertical shading and moving object smear.

It would therefore be desirable to be able to provide improved image pixels for imaging devices.

DETAILED DESCRIPTION

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be configured to operate in global shutter mode or rolling shutter mode. In image sensors that operate in global shutter mode, each image pixel may include a photodiode for detecting incoming light and a separate storage diode for temporarily storing charge. To maximize the efficiency of the global shutter image pixel array, image pixels may include light guide structures and light shield structures. The light guide structures may be used to funnel light away from the storage node and into the photodiode, while the light shield structures (sometimes referred to as buried light shields) may be formed over storage nodes to block light from entering the storage nodes. The light guide structures and light shield structures may overlap each other to further protect the storage node from parasitic light.

Figure 1:
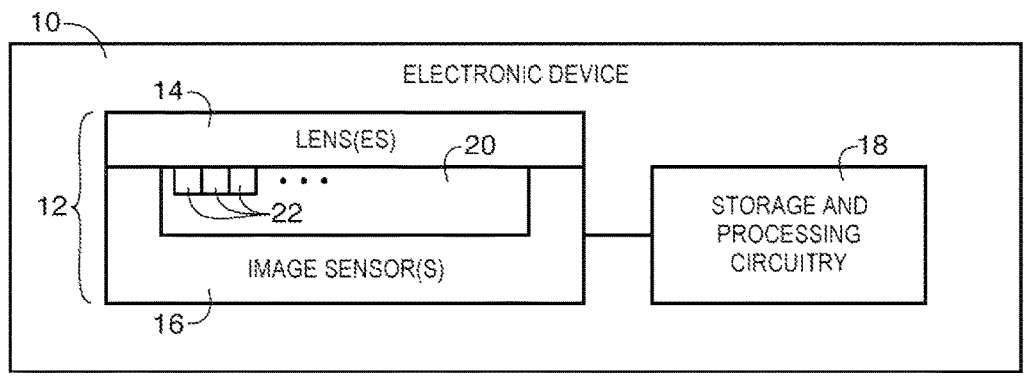
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may be a front side illuminated image sensor or may, if desired, be a backside illumination image sensor. If desired, camera module 12 may be provided with an array of lenses 14 and an array of corresponding image sensors 16.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices. Arrangements in which image pixels 22 are front side illumination image pixels are sometimes described herein as an example. This is, however, merely illustrative. If desired, image pixels 22 may be backside illumination image pixels.

Image sensor pixels 22 may be configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
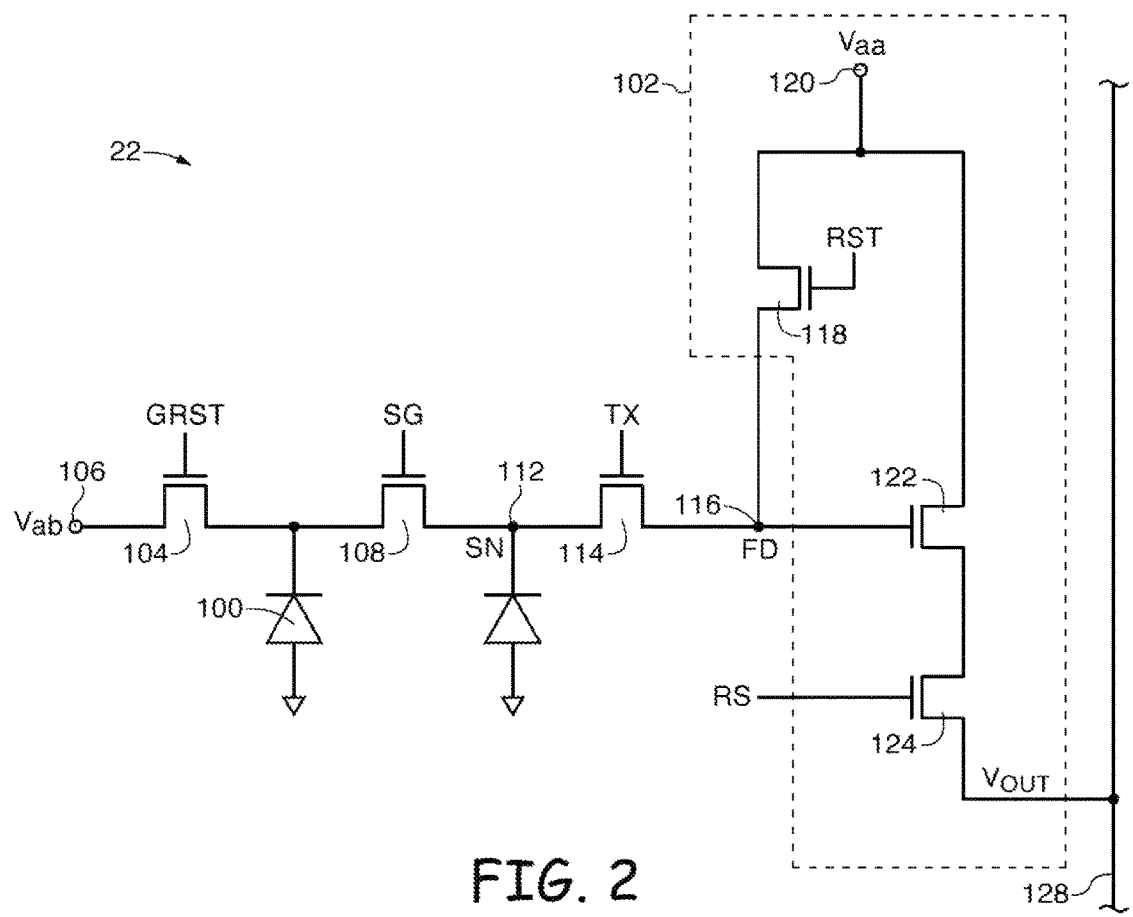
FIG. 2 is a diagram of an illustrative image sensor pixel that may be used to support global shutter operation in accordance with an embodiment of the present invention.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa may be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (sometimes referred to as the integration time).

Before an image is read out, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GRST may be pulsed high to reset photodiode 100 to power supply voltage Vab (e.g., by passing Vab to photodiode 100 through global reset transistor 104).

Pixel 22 may further include a storage transistor 108 operable to transfer charge from photodiode 100 to storage node (sometimes referred to as a charge storage region or storage region) 112. Charge storage region 112 may be a semiconductor diode (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a storage node SN.

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a floating diffusion region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g., an output signal having a magnitude that is proportional to the amount of charge at floating diffusion node 116) is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 128. Image data Vout may be fed to processing circuitry 18 for further processing. The circuitry of FIG. 2 is merely illustrative. If desired, pixel 22 may include other pixel circuitry.

Figure 3:
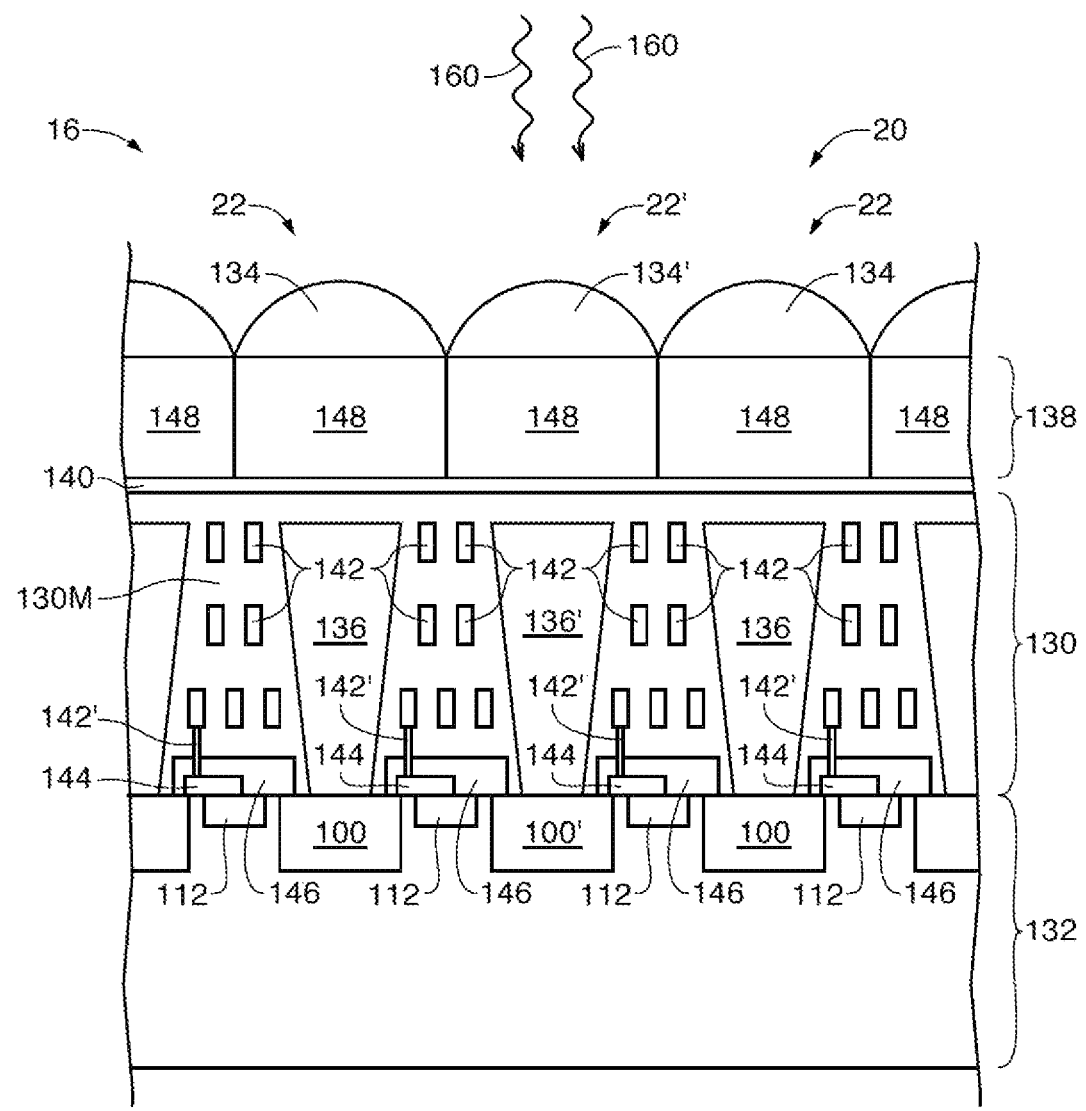
FIG. 3 is a cross-sectional side view of a portion of an illustrative pixel array having light guide structures and light shield structures in accordance with an embodiment of the present invention.

FIG. 3 is a cross-sectional side view of a portion of an illustrative image sensor having an array of image pixels 22 operable in global shutter mode. As shown in FIG. 3, each pixel 22 may include a photosensitive element such as photodiode 100. Photodiodes 100 may be formed in a surface of semiconductor substrate 132 (e.g., a p-type silicon substrate). Storage diode regions 112 and other pixel structures (e.g., pixel structures of the type shown in FIG. 2 such as floating diffusion region 116 and transistors 104, 108, 114, 118, and 124) may also be formed in the surface of substrate 132 in regions between adjacent or neighboring photodiodes 100. Storage gate structures 144 (e.g., a gate of storage transistor 108 of FIG. 2) may be formed on the surface of substrate 132 may also be formed between adjacent photodiodes 100.

A dielectric stack such as dielectric stack 130 may be formed on the surface of substrate 132. Dielectric stack 130 may be formed from dielectric material 130M such as silicon oxide ($SiO_2$). Interconnect routing structures such as interconnect routing structures 142 may be formed in dielectric stack 130 to contact the various pixel transistor terminals. Interconnect routing structures 142 may include conductive structures such as metal signal routing paths and metal vias. Dielectric stack 130 may sometimes be referred to as an intermetal dielectric layer, an intermetal dielectric stack, an interconnect stack, or an interlayer dielectric (ILD). If desired, anti-reflective coatings may be formed on the surfaces of metal routing structures 142 to help prevent light from being reflected off of metal routing structures 142.

A color filter array such as color filter array 138 may be formed over interconnect stack 130. Color filter array 138 may include an array of color filter elements such as color filter elements 148. Each color filter element 148 may be configured to pass light in a given portion of the electromagnetic spectrum while blocking light outside of that portion of the electromagnetic spectrum. For example, each color filter element may be configured to pass one or more of: green light, red light, blue light, cyan light, magenta light, yellow light, infrared light and/or other types of light.

If desired, a passivation layer such as passivation layer 140 may be interposed between color filter array 138 and interconnect stack 130.

A microlens array may be formed over color filter array 138. The microlens array may include a plurality of microlenses 134 each formed over a respective one of color filter elements 148. Each microlens 134 may be configured to focus light towards an associated one of photodiodes 100.

Incoming light 160 passes through microlenses 134 and is directed towards corresponding photodiodes 100. For example, light entering microlens 134' may be directed towards photodiode 100'. Care must be taken to ensure that stray light does not strike regions on substrate 132 between adjacent photodiodes 100 and result in undesired crosstalk and reduction in global shutter efficiency. Image sensor 16 may include light guide and light shield structures to help funnel light 160 to the appropriate photodiode while also preventing stray light from undesirably affecting the amount of charge in storage diode region 112.

As shown in FIG. 3, light guide structures such as light guide structures 136 may be used to direct light into respective photodiodes 100 and to reduce scattering and diffracting of light into storage nodes 112. For example, pixel 22' may include light guide structure 136' for funneling light towards photodiode 100'. Light guide structures 136 may be formed from one or more materials having a different index of refraction than that of material 130M of interconnect stack 130. For example, material 130M of interconnect stack 130 may have a lower index of refraction that that of light guide structure 136. Light guide structures 136 may, for example, be formed from light guide material that fills etched cavities in dielectric material 130M. The cavities may be filled with a light guide material such as organo-siloxane-based polymer materials, silicon nitride, silicon carbide, air, or other suitable materials having a higher index of refraction than dielectric material 130M.

If desired, additional light-controlling structures may be used to help prevent light from being scattered or diffracted into storage nodes 112. For example, as shown in FIG. 3, pixel array 20 may include light shield structures such as light shield structures 146. Each light shield structure 146 may cover a corresponding one of storage nodes 112 and may have a gap or opening through which metal interconnects 142' electrically couple to storage gate 144. Light shield structures 146 may be formed from non-transparent material to block light from entering storage node 112. Each light shield structure 146 may include an upper layer of anti-reflective coating to help prevent stray light from reflecting off of light shield 146, striking nearby metal interconnect structures 142, and scattering back towards storage node 112. The use of light shield structures 146 is merely illustrative, however. If desired, light guide structures 136 may be implemented without additional light-controlling structures such as light shield structures 146.

Figure 4:
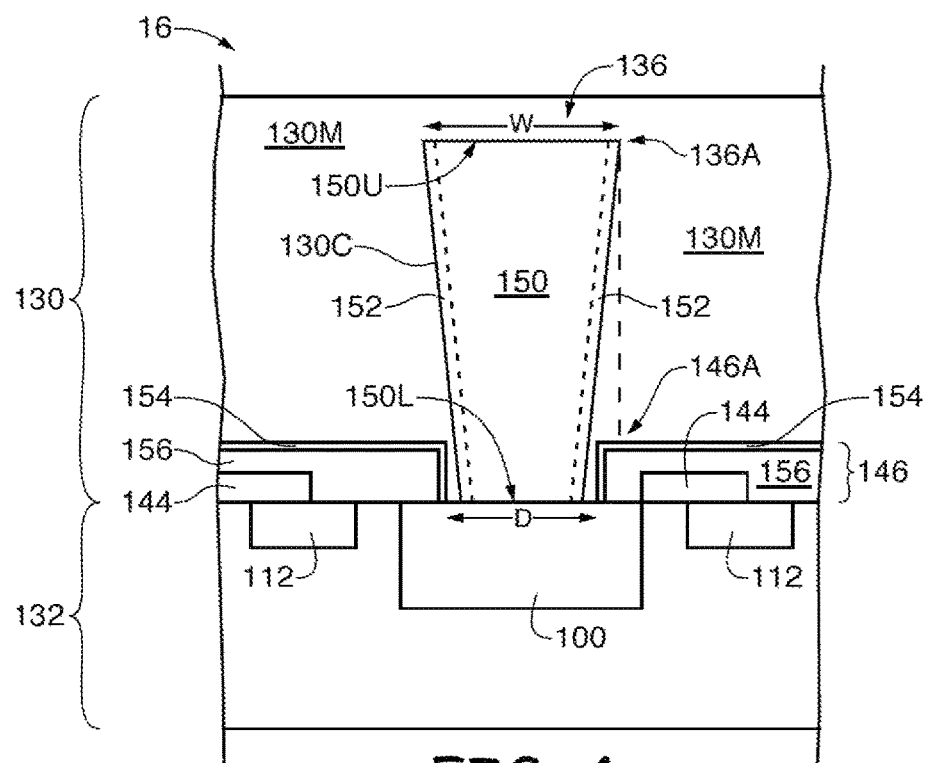
FIG. 4 is a cross-sectional side view of a portion of an illustrative pixel array having light guide structures that fill cone-shaped cavities in a dielectric material and light shield structures having an anti-reflective coating in accordance with an embodiment of the present invention.

FIG. 4 is a cross-sectional side view of an illustrative arrangement for light guide structures 136 and light shield structures 146. As shown in FIG. 4, light guide structures 136 may include light guide material 150 within a cavity such as cavity 130C in dielectric material 130M. Light guide material 150 may have a conical-like shape in which the area of upper surface 150U of material 150 is larger than the area of lower surface 150L of material 150. Light guide material 150 may, for example, have a polygonal or circular horizontal cross section. Suitable materials that may be used for light guide material 150 include organo-siloxane technology based polymer materials, silicon nitride, silicon carbide, air, or other suitable materials having a higher index of refraction than dielectric material 130M.

Light guide material 150 may, for example, be an organo-siloxane technology based polymer having an index of refraction of 1.66, while material 130M may be silicon oxide having an index of refraction of 1.46. As another illustrative example, metal interconnect lines 142 (FIG. 3) may have an index of refraction of less than 1 and may be arranged such that air (with an index of refraction of 1 or slightly greater than 1) may be used for light guide material 150. These are merely illustrative examples, however. In general, any suitable material having a higher refractive index than that of material 130M may be used for light guide material 150 (e.g., materials having a refractive index of 1, greater than 1, greater than 2, less than 2, etc.). If desired, the material used for light guide material 150 may be selected based on the spectral sensitivity of pixels 22 (e.g., based on whether pixel 22 is a colored pixel configured to gather colored light, an infrared pixel configured to gather infrared light, etc.).

If desired, the interior of the walls that form cavity 130C may be coated with thin films to form a reflective surface. As shown in FIG. 4, thin film coating layers 152 (sometimes referred to as reflective layer or thin film reflective layer 152) may optionally be formed on the interior of the walls that form cavity 130C (i.e., interposed between dielectric material 130M and light guide material 150). Thin film coating layers 152 may include a stack of thin films alternating between high and low indices of refraction. For example, thin film coating layers 152 may include one or more layers of a first material having a first index of refraction (e.g., an index of refraction of 1.2 or about 1.2) and one or more layers of a second material having a second index of refraction (e.g., an index of refraction of 2 or about 2). The first and second materials may be alternated with each other in stack formation such that the composite thin film coating becomes reflective to help funnel light away from storage node 112 to photodiode 100. This is, however, merely illustrative. If desired, thin film coating layers 152 may include thin films having other indices of refraction or thin film coating layers 152 may be omitted (e.g., light guide material 150 may contact dielectric material 130M directly).

As shown in FIG. 4, light shield structures 146 may include non-transparent material 156 at least partially covered with an anti-reflective coating such as anti-reflective coating 154. Suitable materials that may be used to form non-transparent layer 156 may include tungsten, aluminum, copper, other metals or materials, or a combination of two or more of these materials. Anti-reflective coating 154 may, for example, include one or more layers of thin films formed from silicon nitride, silicon oxide, titanium nitride, silicon carbide, other suitable materials, or a combination of two or more of these materials. Anti-reflective coating 154 may form an absorptive filter for a desired wavelength to help prevent light from reflecting off of metal layer 146, striking nearby metal interconnect structures 142, and scattering back towards storage node 112.

Portions of light guide structures 136 may, if desired, overlap portions of light shield structures 146 to further reduce the chance that stray light will be able to reach storage node 112. For example, as shown in FIG. 4, upper portion 136A of light guide structure 136 overlaps portion 146A of light shield structure 146. In other words, the upper surface of light guide material 150 may have a width W that is larger than a distance D between adjacent (neighboring) light shield structures 146.

Figure 5:
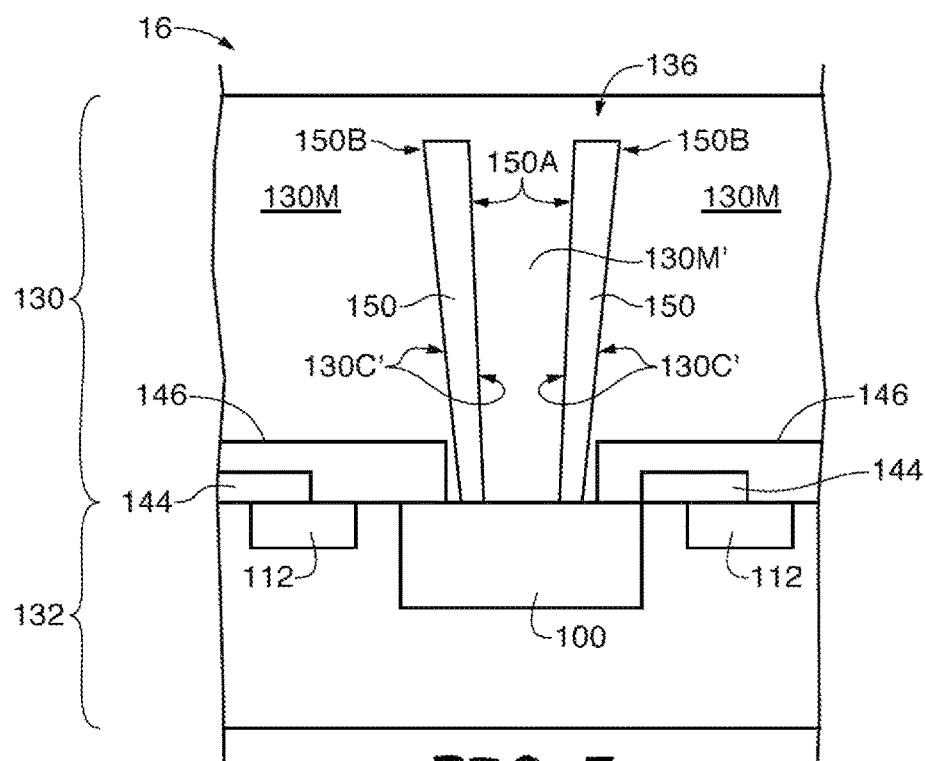
FIG. 5 is a cross-sectional side view of a portion of an illustrative pixel array having light guide sidewall structures with a ring-shaped horizontal cross section in accordance with an embodiment of the present invention.

In some configurations, it may be desirable to form light guide structure 136 from sidewalls of light guide material rather than a solid cone of light guide material of the type shown in FIG. 4. FIG. 5 is a cross-sectional side view of a portion of image sensor 16 showing a configuration for light guide structure 136 in which light guide material 150 forms sidewalls that surround dielectric material 130M' of interconnect layer 130. Light guide structure 136 of FIG. 5 may be formed by etching a cavity such as cavity 130C' in material 130M and filling the cavity with light guide material 150. Cavity 130C' in material 130M may have a ring-shaped horizontal cross section with an inner perimeter and an outer perimeter. Light guide material 150 may fill cavity 130C' such that light guide material 150 also has a ring-shaped horizontal cross section with an inner perimeter defined by inner surface 150A and an outer perimeter defined by outer surface 150B. Light guide material 150 may form vertical sidewalls between photodiode 100 and neighboring storage nodes 112. As shown in FIG. 5, light guide sidewalls 150 completely surround portions such as portions 130M' of dielectric material 130M.

Forming light guide structures 136 with vertical sidewalls of light guide material 150 may be beneficial for larger pixels in which the use of large amounts of light guide material might lead to cracks or void formation. The configuration of FIG. 5 is merely illustrative, however. If desired, light guide structures 136 may be a solid cone of light guide material 150 of the type shown in FIG. 4.

Figure 6:
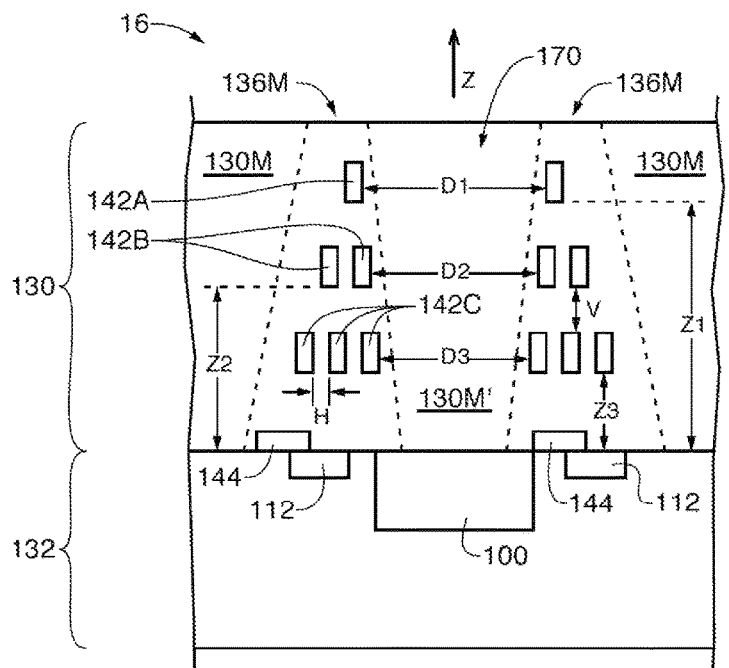
FIG. 6 is a cross-sectional side view of a portion of an illustrative pixel array having light guide structures formed partially from metal routing lines in accordance with an embodiment of the present invention.

Another suitable configuration for light guide structures is shown in FIG. 6. In the illustrative example of FIG. 6, light guide structures 136M are formed using metal interconnect structures 142 in interconnect stack 130. Metal interconnect structures 142 may be arranged in dielectric material 130M in such a way as to create a light funnel that directs light away from storage node 112 and towards photodiode 100. In configurations of the type shown in FIG. 6 where light guide structures 136M are formed over storage nodes 130 and where dielectric material 130M' is formed over photodiodes 100, the refractive index of light guide structures 136M may be less than that of dielectric material 130M' of layer 130.

In one illustrative arrangement, metal interconnect structures 142 may be arranged to form a near-field diffractive element. For example, metal interconnect structures 142 may include metal lines having a ring-shaped horizontal cross section that surrounds dielectric material 130M' above photodiode 100. The number of ring-shaped metal lines 142 that surround material 130M' at a given position along the z-axis of FIG. 6 may vary based on the vertical distance from the metal line to the surface of substrate 132. For example, metal lines 142A at height Z1 with respect to substrate 132 may form one metal ring; metal lines 142B at height Z2 with respect to substrate 132 may form two concentric metal rings; and metal lines 142C at height Z3 with respect to substrate 132 may form three concentric metal rings, with Z2 being greater than Z3 and less than Z1.

The diameter of metal rings 142 may also vary based on location along the z-axis. For example, metal lines 142A at height Z1 with respect to substrate 132 may have an innermost diameter D1; metal lines 142B at height Z2 with respect to substrate 132 may have an innermost diameter D2; and metal lines 142C at height Z3 with respect to substrate 132 may have an innermost diameter D3, with D2 being greater than D3 and less than D1. With this type of configuration, metal lines 142 form a funnel shape that surrounds dielectric material 130M' and that directs light away from storage node 112 and towards photodiode 100. The series of concentric annular structures formed by metal structures 142 (e.g., metal structures 142A, 142B, and 142C) forms a near-field diffractive element (sometimes referred to as a Fresnel diffractive element) that guides light within aperture 170 towards photodiode 100.

The example of FIG. 6 in which interconnect layer 130 includes three layers of metal rings (142A, 142B, and 142C) and in which the three layers respectively include one metal ring, two metal rings, and three metal rings is merely illustrative. In general, interconnect layer 130 may include any suitable number of layers of metal lines and each layer may include any suitable number of metal rings.

The optical properties of the near-field diffractive element formed by metal interconnect structures 142 in dielectric material 130M may be determined based on the horizontal spacing H between adjacent metal rings at a given z-height with respect to substrate 132. Vertical spacing V between each layer of metal lines (e.g., vertical spacing V between structures 142B and 142C) may also help determine the optical properties of the near-filed diffractive element. During the fabrication process, spacing such as horizontal spacing H, vertical spacing V, and inner diameters D1, D2, and D3 may be determined to obtain a near-field diffractive element having the desired optical properties. The near-field diffractive element may be formed from alternating layers of dielectric material 130M and metal structures 142.

The example of FIG. 6 in which light guides 136M surround dielectric material 130M' is merely illustrative. Metal may have a refractive index of less than 1, which allows material 130M' to be any suitable optical material having a refractive index of greater than 1. For example, metal lines may surround a light guide material such as light guide material 150 of FIGS. 3 and 4 (e.g., organo-siloxane technology based polymer materials, silicon nitride, silicon carbide, air, or other suitable materials having a higher index of refraction than that of light guide structure 136M of FIG. 6).

If desired, image sensor 16 of FIG. 6 may also be provided with light shield structures 146 of the type shown in FIGS. 3 and 4.

Figure 7:
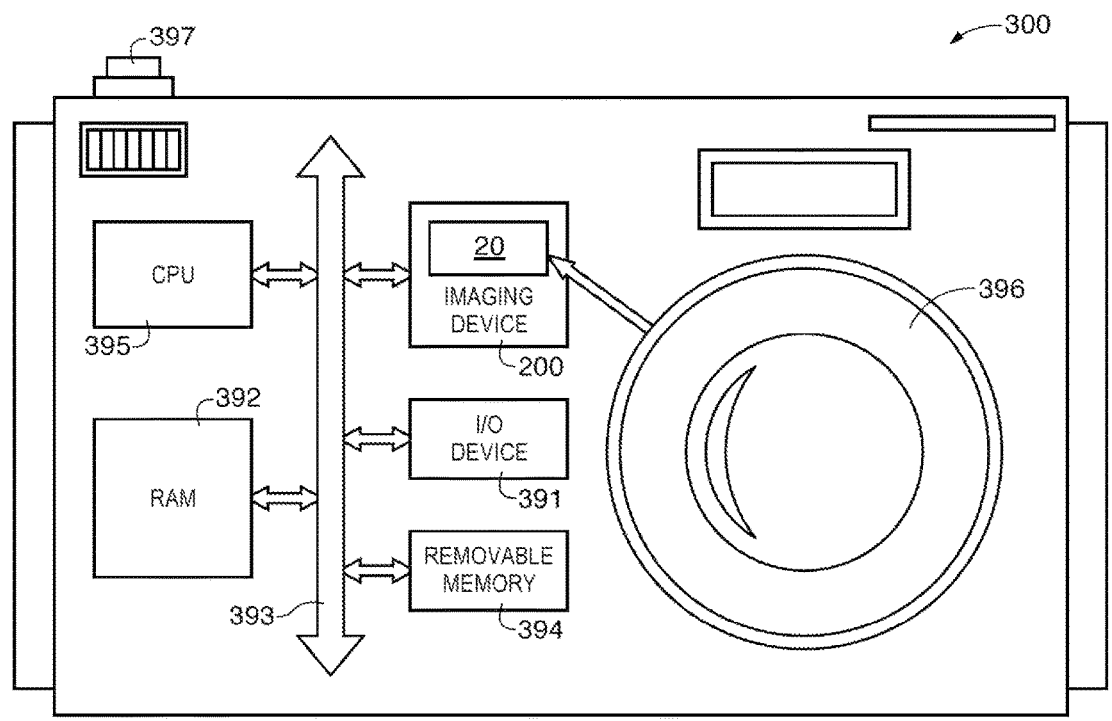
FIG. 7 is a block diagram of a system that may employ the embodiments of FIGS. 1-6 in accordance with an embodiment of the present invention.

FIG. 7 shows in simplified form a typical processor system 300, such as a digital camera, which includes an imaging device 200. Imaging device 200 may include a pixel array 20 (e.g., a pixel array such as pixel array 20 of FIG. 1 having light guide structures 136 and, if desired, light shield structures 146). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having image sensors with pixel arrays that are operable in global shutter mode. The global shutter image pixels may include light guide structures and, if desired, light shield structures. A light guide structure may help funnel light toward an associated photodiode and away from regions between neighboring photodiodes such as storage node regions.

Buried light shields may at least partially cover storage nodes and associated storage gates to help prevent light from entering the storage nodes. The light shields may include a non-transparent metal layer that is at least partially covered with an anti-reflective coating. Gaps or openings may be formed in the light shield to allow metal interconnect structures to electrically couple to the gates under the light shield.

In one suitable embodiment, light guide structures may be formed from light guide material that fills cone-shaped openings or cavities in a dielectric layer above the photodiodes. The light guide material may include organo-siloxane technology based polymer materials, silicon nitride, silicon carbide, air, other suitable materials, or a combination of these materials. Each cone of light guide material may be formed over a respective one of the photodiodes and may have a higher refractive index than that of the dielectric material in which the cavities are formed.

In another suitable embodiment, light guide structures may be formed from sidewalls of light guide material rather than a solid cone of light guide material. The sidewalls may have a ring-shaped horizontal cross-section and may surround dielectric material such as silicon oxide.

In another suitable embodiment, metal interconnect structures and dielectric layers may be arranged to form a near-field diffractive element that funnels light away from storage nodes and towards the appropriate photodiode. The metal interconnect structures may be concentric metal rings arranged in layers, with each layer including one or more metal rings with different diameters to form a Fresnel diffractive element. Metal rings within a given layer may be spaced to obtain the desired optical properties. The stack of dielectric layers and metal rings may surround dielectric material above the photodiode, which may be silicon oxide, organo-siloxane technology based polymer materials, silicon nitride, silicon carbide, air, other suitable materials, or a combination of these materials.

The foregoing is merely illustrative of the principles of this invention which can be practiced in other embodiments.

What is claimed is:

1. An image sensor operable in global shutter mode and having a substrate and a dielectric material formed over the substrate, comprising:
   a photodiode formed in the substrate;
   a storage node formed in the substrate;
   a light guide structure formed in the dielectric material over the photodiode, wherein the light guide structure has a ring-shaped horizontal cross section with an inner perimeter defined by an inner surface of the light guide structure and an outer perimeter defined by an outer surface of the light guide structure, wherein the light guide structure has a higher refractive index than that of the dielectric material, wherein the light guide structure forms light guide sidewalls, wherein a portion of the dielectric material is completely surrounded by the light guide sidewalls, and wherein the portion of the dielectric material overlaps the photodiode; and
   a light shield formed in the dielectric material over the storage node.

2. The image sensor defined in claim 1 further comprising an anti-reflective coating that at least partially covers the light shield.

3. The image sensor defined in claim 2 further comprising a storage gate formed on the substrate, wherein the light shield at least partially covers the storage gate.

4. The image sensor defined in claim 1 wherein a portion of the light guide structure overlaps a portion of the light shield.

5. An image sensor operable in global shutter mode and having a substrate and a dielectric material formed over the substrate, comprising:
   a photodiode formed in the substrate;
   a storage node formed in the substrate; and
   a plurality of concentric annular metal structures formed in the dielectric material over the storage node, wherein the plurality of metal rings form a near-field diffractive element that guides light towards the photodiode, wherein a portion of the dielectric material is surrounded by the plurality of concentric annular metal structures, and wherein the portion of the dielectric material overlaps the photodiode.

6. The image sensor defined in claim 5 wherein the plurality of concentric annular metal structures comprises a first metal ring located a first distance from the substrate, a second metal ring located a second distance from the substrate, and a third metal ring located a third distance from the substrate, wherein the second distance is less than the first distance and greater than the third distance.

7. The image sensor defined in claim 6 wherein the first metal ring has a first diameter, the second metal ring has a second diameter, and the third metal ring has a third diameter, wherein the second diameter is less than the first diameter and greater than the third diameter.

8. The image sensor defined in claim 7 further comprising a fourth metal ring located the second distance from the substrate and having a fourth diameter larger than the second diameter.

9. The image sensor defined in claim 8 further comprising fifth and sixth metal rings located the third distance from the substrate and having respective fifth and sixth diameters that are larger than the third diameter.

10. The image sensor defined in claim 5 further comprising:
    a light shield formed in the dielectric material over the storage node; and
    an anti-reflective coating that at least partially covers the light shield.

11. The image sensor defined in claim 10 wherein the light shield comprises a metal selected from the group consisting of: tungsten, aluminum, and copper.

12. The image sensor defined in claim 11 further comprising a storage gate formed on the substrate, wherein the light shield at least partially covers the storage gate, and wherein the light shield has an opening through which one of the concentric annular metal structures electrically couples to the storage gate.

* * * * *